(12) United States Patent
Fletcher et al.

(10) Patent No.: US 9,673,759 B1
(45) Date of Patent: Jun. 6, 2017

(54) OFF-CHIP DISTRIBUTED DRAIN BIASING OF HIGH POWER DISTRIBUTED AMPLIFIER MONOLITHIC MICROWAVE INTEGRATED CIRCUIT (MMIC) CHIPS

(71) Applicant: Raytheon Company, Waltham, MA (US)

(72) Inventors: David R. Fletcher, Allen, TX (US); David D. Heston, Dallas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/976,427

(22) Filed: Dec. 21, 2015

(51) Int. Cl.
*H03F 3/60* (2006.01)
*H03F 1/02* (2006.01)
*H03F 1/56* (2006.01)
*H03F 3/193* (2006.01)

(52) U.S. Cl.
CPC ........... *H03F 1/0205* (2013.01); *H03F 1/565* (2013.01); *H03F 3/193* (2013.01); *H03F 2200/451* (2013.01); *H03F 2200/555* (2013.01)

(58) Field of Classification Search
CPC ....................................................... H03F 3/60
USPC .......................................... 330/53, 286, 302
See application file for complete search history.

(56) References Cited

U.S. PATENT DOCUMENTS

| | | | |
|---|---|---|---|
| 2,934,710 A | 11/1956 | Percival | |
| 4,486,719 A | 12/1984 | Ayasli | |
| 4,864,250 A | 9/1989 | Bacon | |
| 5,208,547 A * | 5/1993 | Schindler | H03F 3/607 330/277 |
| 6,049,250 A | 4/2000 | Kintis et al. | |
| 6,566,956 B2 * | 5/2003 | Ohnishi | H03F 3/607 330/286 |
| 6,798,313 B2 | 9/2004 | Buer | |
| 7,095,293 B2 | 8/2006 | Buer | |
| 7,339,444 B2 | 3/2008 | Buer | |
| 8,013,680 B2 | 9/2011 | Grondahl et al. | |
| 8,076,975 B1 * | 12/2011 | Lender, Jr. | H03F 3/607 330/286 |
| 9,013,237 B1 | 4/2015 | Kennan et al. | |
| 2002/0008583 A1 * | 1/2002 | Shigematsu | H03F 1/086 330/286 |
| 2004/0075515 A1 | 4/2004 | Kyogoku | |
| 2008/0030278 A1 * | 2/2008 | Shin | H03F 1/56 330/286 |
| 2015/0194942 A1 * | 7/2015 | Anderson | H03F 3/213 330/295 |

* cited by examiner

*Primary Examiner* — Patricia T Nguyen
(74) *Attorney, Agent, or Firm* — Eric A. Gifford

(57) ABSTRACT

Off-chip distributed drain biasing increases output power and efficiency for high power distributed amplifier MMICs. An off-chip bias circuit has a common input for receiving DC bias current and a plurality of parallel-connected bias chokes among which the DC bias current is divided. The chokes are connected to a like plurality of drain terminals at different FET amplifier stages to supply DC bias current at different locations along the output transmission line. Off-chip distributed drain biasing increases the level of DC bias current that can be made available to the amplifier and add inductances to selected FET amplifier stages, typically the earlier stages, to modify the load impedance seen at the drain terminal to better match the amplifier stages to improve power and efficiency.

20 Claims, 5 Drawing Sheets

OFF-CHIP DISTRIBUTED DRAIN BIASING OF HIGH POWER DISTRIBUTED AMPLIFIER MONOLITHIC MICROWAVE INTEGRATED CIRCUIT (MMIC) CHIPS

BACKGROUND OF THE INVENTION

Field of the Invention

This invention relates to biasing of distributed amplifier monolithic microwave integrated circuits (MMICs), and more particularly to an off-chip DC bias circuit for distributed drain biasing of a high power distributed amplifier MMIC.

Description of the Related Art

A Monolithic Microwave Integrated Circuit, or MMIC, is a type of integrated circuit (IC) device that operates at microwave frequencies (300 MHz to 300 GHz). These devices typically perform functions such as microwave mixing, power amplification, low-noise amplification, and high-frequency switching. Inputs and outputs on MMIC devices are frequently matched to a characteristic impedance of 50 ohms. This makes them easier to use, as cascading of MMICs does not then require an external matching network. Additionally, most microwave test equipment is designed to operate in a 50-ohm environment.

MMICs are dimensionally small (from around 1 mm$^2$ to 20 mm$^2$) and can be mass-produced, which has allowed the proliferation of high-frequency devices such as cellular phones. MMICs were originally fabricated using gallium arsenide (GaAs), a III-V compound semiconductor. It has two fundamental advantages over silicon (Si), the traditional material for IC realization: device (transistor) speed and a semi-insulating substrate. Both factors help with the design of high-frequency circuit functions. However, the speed of Si-based technologies has gradually increased as transistor feature sizes have reduced, and MMICs can now also be fabricated in Si technology. Other technologies such as indium phosphide (InP), Silicon germanium (SiGe) and Gallium nitride (GaN) are also options for MMICs. Originally, MMICs used MEtal-Semiconductor Field-Effect Transistors (MESFETs) as the active device. More recently High Electron Mobility Transistors (HEMTs), Pseudomorphic HEMTs and Heterojunction Bipolar Transistors have become common.

DC bias circuitry typically occupies about 15% to 20% of the total chip area. DC bias circuitry may function as both a DC power supply path to transistors and an RF block ("bias choke"). In high power applications, such as the MMIC, the DC bias circuitry typically employs wide transmission lines to accommodate the large current flow to transistors. On-chip capacitors are configured for providing an RF choke. The high impedance transmission line acts as a virtual open to the RF signals, and the on-chip capacitors are configured to short residual RF signals to ground.

U.S. Pat. No. 6,798,313 entitled "Monolithic Microwave Integrated Circuit with Bondwire and Landing Zone Bias" issued Sep. 28, 2004 discloses an approach for moving the DC bias circuitry off-chip such that on-chip bias circuitry can be reduced and/or eliminated. In an embodiment of a multi-stage RF power amplifier, which amplifies RF signals over a narrowband e.g., 10% of the central frequency, a bondwire is attached between a landing zone located at a suitable location on the MMIC to supply bias current and an off-chip capacitor. The bondwire may be configured to provide the RF impedance that was provided by the on-chip bias circuitry. The bond wire may be configured to have any suitable length to create a virtual open. The bond wire length may then suitably depend on the frequency being blocked. For example, the bond wire may be selected to be a quarter-wave bond wire. The length of an exemplary bond wire may be about 100 mils for a 30 GHz signal. In this case, the length of the bond wire may have a tolerance of, for example, plus or minus 30 mils. The off-chip bias feed system may thus be configured to not significantly impact the overall RF impedance of the system by placing a high RF impedance bond wire in parallel with a low RF impedance matching structure.

Another class of MMIC amplifiers is a distributed amplifier, which amplifies RF signals over a much wider bandwidth (e.g. at least 120% of the central frequency) with less gain than a multi-stage power amplifier to obtain a larger gain-bandwidth product. Distributed amplifiers use transmission lines to temporally split the signal and amplify each portion separately to achieve higher bandwidth than possible from a single amplifier. The outputs of each stage are combined in the output transmission line. The distributed amplifier includes a pair of transmission lines with characteristic impedances of $Z_0$ independently connecting the inputs and outputs of several active devices (e.g., FETs). An RF signal is thus supplied to the section of transmission line connected to the input of the first device. As the input signal propagates down the input line, the individual devices respond to the forward traveling input wave by inducing an amplified complementary forward traveling wave on the output line. This assumes the delays of the input and output lines are made equal through selection of propagation constants and lengths of the two lines and as such the output signals from each individual device sum in phase. Terminating resistors $Z_g$ and $Z_d$ are placed to minimize destructive reflections. The transconductive gain of each device is $g_m$ and the output impedance seen by each transistor is half the characteristic impedance of the transmission line. So that the overall voltage gain is: $A_v = \frac{1}{2} n \cdot g_m \cdot Z_0$, where n is the number of stages. Neglecting losses, the gain demonstrates a linear dependence on the number of devices (stages). Unlike the multiplicative nature of a cascade of conventional amplifiers, the distributed amplifier demonstrates an additive quality. It is this synergistic property of the architecture that makes it possible for it to provide gain at frequencies beyond that of the unity-gain frequency of the individual stages. In practice, the number of stages is limited by the diminishing input signal resulting from attenuation on the input line.

DC bias circuitry for a MMIC distributed amplifier chip is configured to provide DC bias current at the drain connection of the last transistor (stage). High power amplifiers use a tapered drain line. The 1$^{st}$ stage FET is connected to a skinny line (high impedance) and each succeeding stage has a wider line connecting it. The last FET stage has widest line and the lowest impedance, which provides a good location to place a high impedance choke to bring the DC current into the amplifier. The line width is at a maximum so the current carrying capability of the line is at a maximum and the circuit is the least disturbed by the choke at this point. The bias current is supplied to all of the transistors (stage) as required through the output line.

The DC bias circuitry comprises a series inductor L connected to a grounded capacitor C. The inductor L provides an RF open that blocks signal from being shunted to the bias circuitry and a DC short that allows bias current to flow to the chip. The capacitor provides a DC open that blocks DC current from being shunted to ground and an RF short that allows RF from the bias circuitry to flow to ground to avoid injecting RF noise into the amplifier.

The DC bias circuitry may be provided on-chip for low power distributed amplifiers or off-chip for high power amplifiers. An on-chip inductor is a critical design element and tends to set the performance at the frequency band edges. An inductive line at the low-end of the band tends to look capacitive at the high-end and rolls off RF performance. A bias line suitable for the high-end of the band hurts performance at the low-end. Higher power amplifiers tend to make on-chip bias chokes difficult or impossible to achieve due to the increased line-widths required to handle the higher DC currents. Off-chip inductors (e.g., wire-wound inductors) allow for physically smaller MMICs and can provide the inductance required for higher power distributed amplifiers.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides distributed drain biasing for a high power distributed amplifier MMIC to increase output power and amplifier efficiency.

This is accomplished with a distributed amplifier MMIC chip without on-chip drain bias circuitry. An off-chip bias circuit comprises a common input for receiving a DC bias current and a plurality of parallel-connected bias chokes among which the supplied DC bias current is divided. Each bias choke comprises a series inductor L connected to a grounded capacitor C. A plurality of connections (e.g., bond wires or flip-chip contacts) electrically and physically connect the plurality of series inductors to a like plurality of drain terminals at different FET amplifier stages to supply DC bias current at different locations along the output transmission line. Each series inductor L has sufficient impedance to block RF energy from reaching the common input over the entire bandwidth.

In different embodiments, in existing solutions a single off-chip bias choke can supply a maximum DC bias current that is limited by the diameter of a wire that forms the wire-wound series inductor L. Distributed drain biasing can provide a total DC bias current capability greater than that capable by a single off-chip bias choke, a necessity for higher power amplifiers.

In different embodiments, the inductance values of each series inductor L is configured to modify the load impedance of the FET amplifier stage to which it is connected to approximate a target inductance to improve amplifier power and efficiency.

In different embodiments, one or more of the FET amplifier stages each see a load impedance at its drain terminal that is capacitive over at least the lower end of the bandwidth. The bias choke's series inductor L provides sufficient inductance to modify the load impedance of the FET amplifier stage such that the load impedance is inductive over the entire bandwidth.

In different embodiments, the impedance of the series inductor L is selected to modify the load impedance seen at the drain of the corresponding FET amplifier stage such that the output impedances of the multiple amplifier stages are more closely matched. This produces higher output power and improved amplifier efficiency. The number of chokes and their locations relative to each stage of the distributed amplifier is chosen to maximize the power and efficiency of the amplifier. Typically, the first few stages of the distributed amplifier are the most sensitive to the placement and value of the added inductance supplied by the off-chip bias network.

These and other features and advantages of the invention will be apparent to those skilled in the art from the following detailed description of preferred embodiments, taken together with the accompanying drawings, in which:

DETAILED DESCRIPTION OF THE INVENTION

The present invention provides off-chip distributed drain biasing for a high power distributed amplifier MMIC to increase output power and amplifier efficiency. Off-chip distributed drain biasing increases the level of DC bias current that can be supplied to the amplifier. In addition, distributed drain biasing can add inductance to selected FET amplifier stages, typically the earlier stages, to modify the load impedance seen at the drain terminal to better match the amplifier stages to improve power and efficiency.

Figure 1:
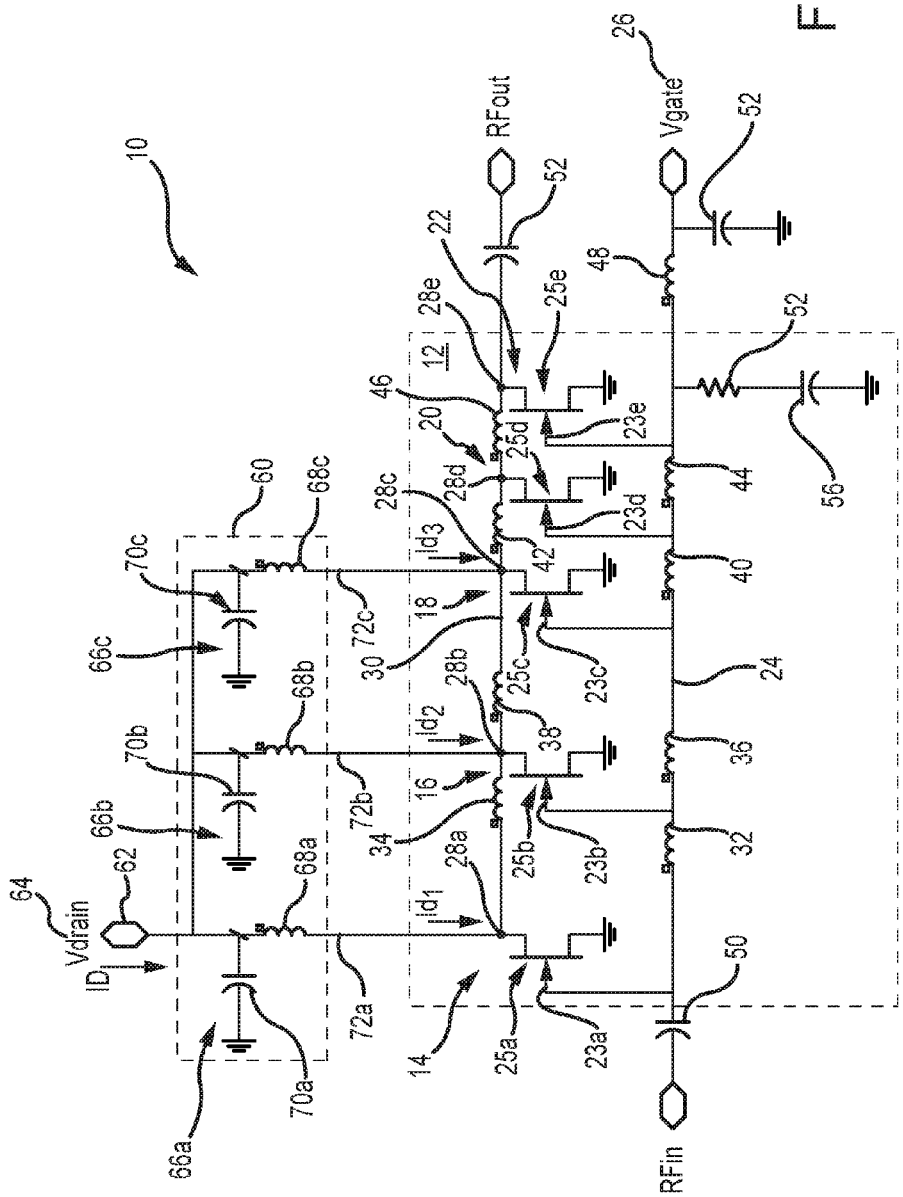
FIGS. 1 and 2 are respectively a schematic diagram and a circuit realization of an embodiment high power 5-stage distributed amplifier MMIC chip with off-chip distributed drain biasing of the first 3 stages.
Figure 2:
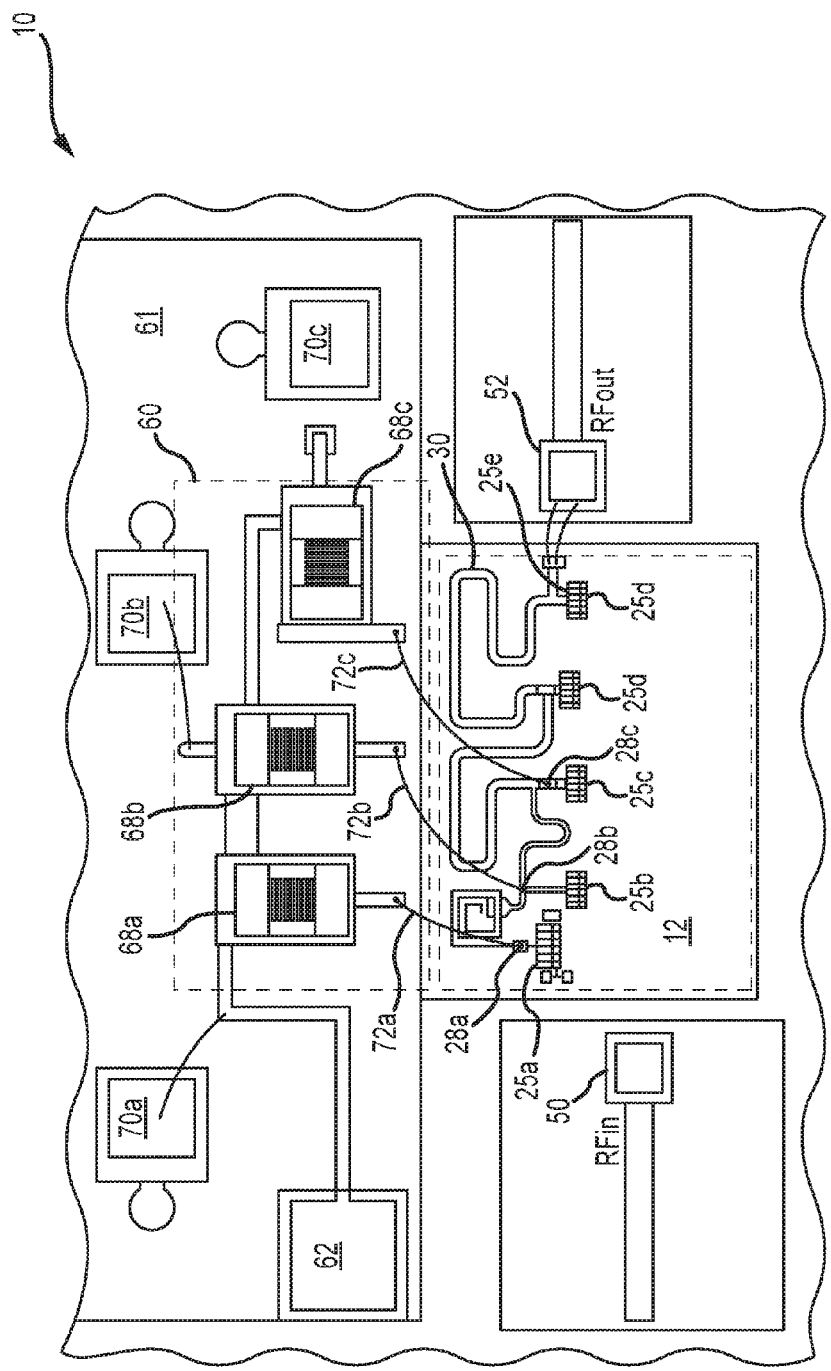

Referring now to FIGS. 1 and 2, an embodiment of a distributed amplifier 10 comprises a distributed amplifier MMIC chip 12. The distributed amplifier MMIC chip 12 includes a plurality of cascaded amplifier stages 14, 16, 18, 20 and 22, for example. Each amplifier stage 14-22 includes a transistor, which may be a FET, MESFET or HEMT (herein after referred to as FETS 25a-25e for simplicity) connected in a common source configuration. All of the gate terminals 23a-23e of the FETS are connected together forming an input transmission line 24 that is supplied by a DC voltage supply Vgate 26. An off-chip grounded capacitor 52 provides low frequency stability. Similarly, all of the drain terminals 28a-28e of the FETS are connected together forming output transmission line 30. The source terminals are connected to ground. The input and output capacitance of each of the FETS is combined with lumped inductors 32, 34, 36, 38, 40, 42, 44, 46 and 48 formed, for example from microstrip lines, to form distributed impedances, thereby forming the artificial input and output transmission lines 24 and 30. The use of microstrip lines for the lumped inductors makes the topology amenable to being fabricated as a MMIC. An input signal RFin is coupled to input transmission line 24 via a DC blocking capacitor 50 and an output signal RFout is output from output transmission line 30 via a DC blocking capacitor 52.

The artificial transmission lines are coupled together by the transconductance of the FETS. Similarly, the gate line artificial transmission line 24 is terminated at a gate line termination impedance formed by a series connected resistor 54 and a capacitor 56, selected to match the characteristic impedance of the gate line 24. Many factors are known to influence the performance of such distributed amplifiers, such as the cutoff frequency of the selected FET, the cutoff frequency of the artificial transmission lines as well as the transconductance of the selected FET. Even after tuning each of the components to optimize performance, a few of the early FET amplifier stages may be capacitive over at least the lower end of the bandwidth. This reduces both output power and efficiency.

Distributed amplifier 10 also includes an off-chip bias circuit 60 on a printed circuit board 61 configured to supply DC bias currents Id1, Id2 . . . at the drain terminals of different amplifier stages at different locations along output transmission line 30. Without loss of generality, this embodiment has five FET amplifier stages and three bias chokes. In general, the number of FET amplifier stages, the number of bias chokes, which may be the equal or less than the number of FET amplifier stages, the inductance and the position of the bias chokes is chosen to maximize power and efficiency for a given application.

Off-chip bias circuit 60 has a common input 62 for receiving a DC bias current ID from a DC voltage supply Vdrain 64 and a plurality of parallel-connected bias chokes 66a-66c among which the DC bias current is divided, approximately equally, into Id1, Id2 and Id3. The bias chokes 66a-66c include series inductors L 68a-68c connected to grounded capacitor C 70a-70c, respectively. The series inductor L provides an RF open that blocks signal over the bandwidth from being shunted to the bias circuitry and a DC short that allows DC bias current to flow to the MMIC. The capacitor provides a DC open that blocks DC bias current from being shunted to ground and an RF short that allows RF from the bias circuitry to flow to ground to avoid injecting RF noise into the amplifier.

A plurality of connections 72a-72c (e.g., bond wires or flip-chip connections) electrically and physically connect series inductors L 68a-68c to alike plurality of drain terminals 26 at different FET amplifier stages to supply DC bias current Id1, Id2 and Id3 28a-28c at different locations along output transmission line 30. The connections provide a minimal level of inductance, typically less than 15-20% of the inductance required to source bias current and impedance match the amplifier stages over the wide bandwidth of a distributed amplifier. For example, a choke may require 15 nH (nano-Henries) of inductance. A bond wire will provide may be a couple nH. To provide the requisite inductance, typically at least 3 nH, the series inductor L is suitably a wire-wound inductor.

In existing solutions a single off-chip bias choke can supply a maximum DC bias current that is limited by the diameter of a wire that forms the wire-wound series inductor L. Heavier gauge wire could handle higher current levels but changes the RF inductance of the coil. Distributed drain biasing can provide a total DC bias current capability greater than that achievable by a single bias choke, which is needed for higher power amplifiers. Furthermore, distributed drain biasing adds minimal loss compared to a single larger off-chip choke.

Figure 3:
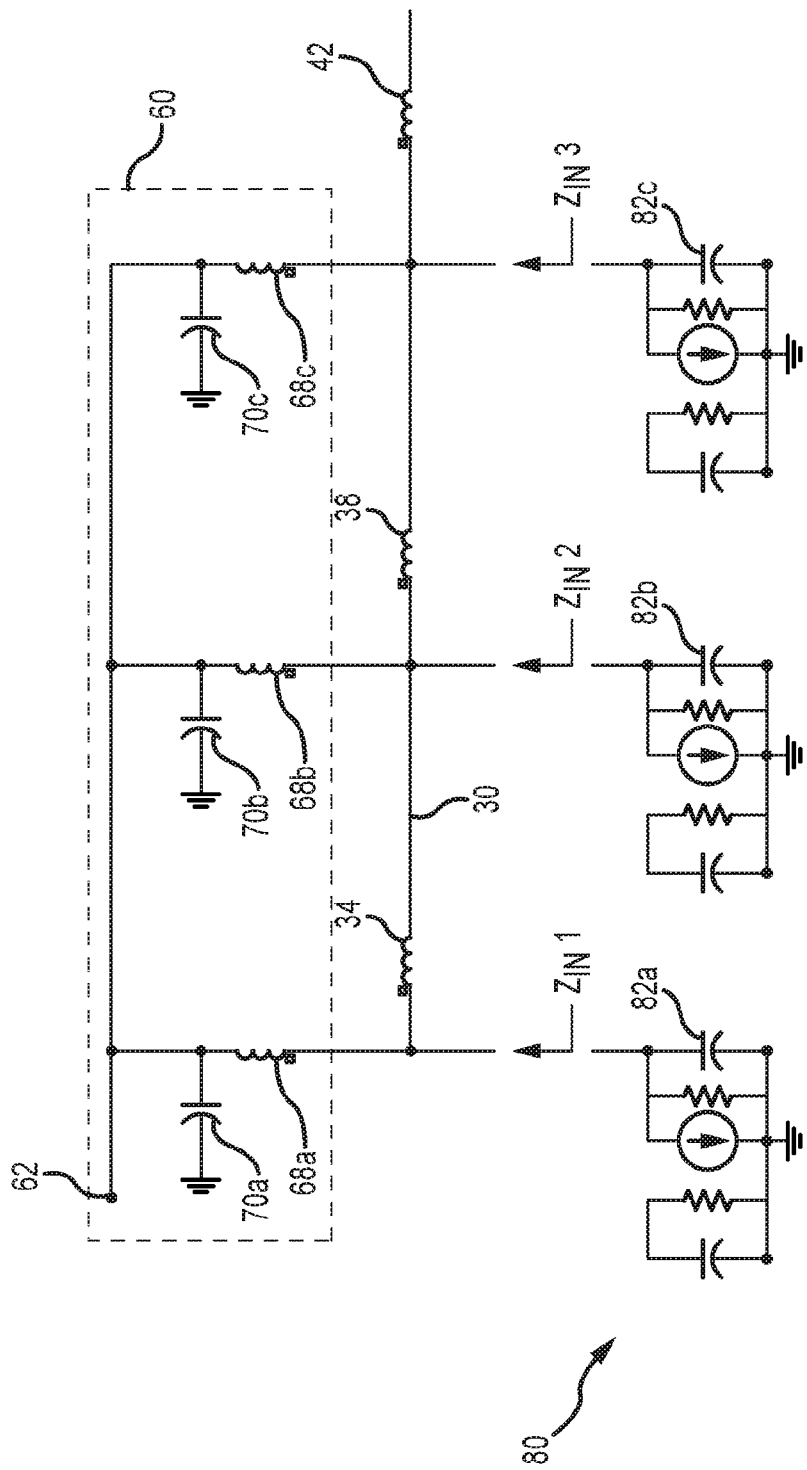
FIG. 3 is schematic diagram of a small signal model of the first 3 amplifier stages and the load impedance seen at the drain terminal.

FIG. 3 depicts a simplified small-signal model 80 of FET amplifier stages 14, 16 and 18 and the load impedance Zin1, Zin2 and Zin3 seen at their drain terminals 28a, 28b and 28c, respectively. For our purposes, the important parameter of the small-signal model is the parasitic drain capacitance 82a-82c of the FET. The distributed amplifier's output transmission line 30 in conjunction with the parasitic drain capacitance of each transistor forms an artificial transmission line that allows the amplifier to achieve a broadband gain/power response.

To maximize the output power and efficiency response of the amplifier each transistor needs to see an impedance at the current source of the transistor that maximizes its power transfer. For a FET this is accomplished by placing the appropriate load impedance at its drain terminal. The load impedance ($Z_{in1}$, $Z_{in2}$, $Z_{in3}$) seen by each FET amplifier stage of the distributed amplifier differs noticeably and is impossible to match exactly to the peak power load. The first few stages of a distributed amplifier typically have a load impedance that is capacitive at lower frequencies of operation whereas the desired peak power load is inductive in nature. This mismatch in load impedance seen by the FET and the desired peak power load results in a loss of output power and efficiency.

The off-chip inductor bias circuit 60 can be configured to provide additional inductance at multiple along the output transmission line 30 to modify the load impedance ($Z_{in1}$, $Z_{in2}$, $Z_{in3}$) from a capacitive load over at least the lower end of the band width to the desired inductive load over the entire band width increasing both the power and efficiency of the amplifier. More particularly, each FET amplifier stage has a target inductance for the load impedance to optimize performance. The inductance value of each series inductor L is selected to modify the load impedance to more closely approximate the target inductance. By design, the inductance values for the different series inductors L will most likely differ. The selection of inductors for realization of the bias circuit may be limited by availability from coil manufacturers. By configuring the bias circuit to connect a choke to each FET amplifier stage whose load impedance is capacitive over at least the lower end of the band width, all of the FET amplifier stages see an inductive load impedance to optimize performance.

Figure 4:
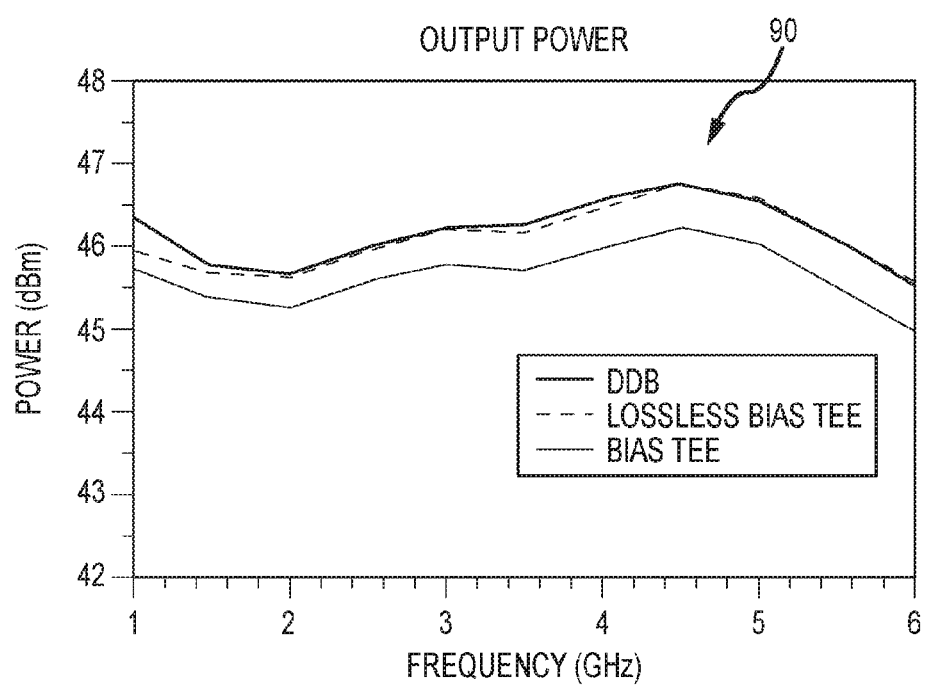
FIG. 4 is a plot of output power vs frequency over the bandwidth of the distributed amplifier for distributed drain biasing and conventional single drain biasing (lossless and lossy)
Figure 5:
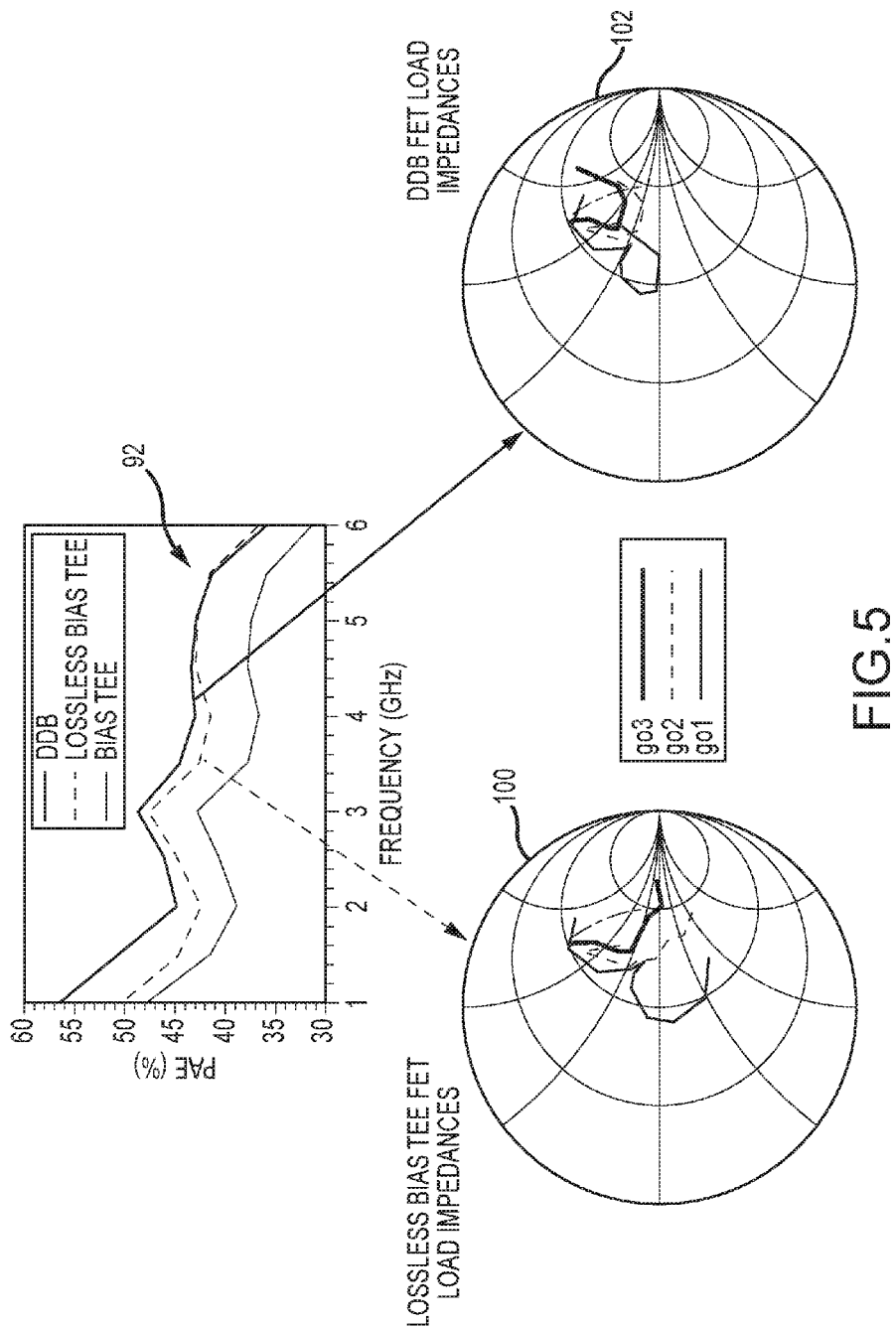
FIG. 5 is a plot of Power Added Efficiency (PAE) vs frequency over the bandwidth of the distributed amplifier for distributed drain biasing and conventional single drain biasing with Smith charts of the load impedances for the first 3 amplifier stages for the distributed drain biasing and lossless single drain biasing.

Referring now to FIGS. 4 and 5, the output power 90 and PAE 92 (Pout–Pin)/Pdc for the 5-stage distributed amplifier MMIC are compared for known off-chip lossy and an ideal lossless Bias Tee chokes and the off-chip distributed drain biasing (DDB) of the current invention. A lossy Bias Tee has roughly 5 points lower PAE and 0.5 dB less power than distributed drain biasing. Distributed drain biasing shows improvement beyond even a lossless Bias Tee. This is due to the improved low frequency matching that is provided by the inductive loading of the bias chokes.

Smith charts 100 and 102 plot the load impedances g01, g02 and g03 seen at the drain terminals of the first three FET amplifier stages for the lossless Bias Tee and the DDB, respectively. In a Smith chart, impedances above equatorial line 104 are inductive whereas impedances below the line are capacitive. As seen in chart 100, the load impedances for at least the $1^{st}$ and $2^{nd}$ amplifier stages for the lossless Bias Tee are capacitive at the lower end of the bandwidth. As seen in chart 102, the load impedance for each of the 1st, 2nd and 3rd amplifier stages for distributed drain biasing are inductive over the entire bandwidth.

While several illustrative embodiments of the invention have been shown and described, numerous variations and alternate embodiments will occur to those skilled in the art.

Such variations and alternate embodiments are contemplated, and can be made without departing from the spirit and scope of the invention as defined in the appended claims.

We claim:

1. A distributed amplifier, comprising:
   a distributed amplifier monolithic microwave integrated circuit (MMIC) chip, said chip comprising an RF input configured to receive an RF signal that propagates down an input transmission line, a plurality of parallel-connected FET amplifier stages and an output transmission line that connects the drain terminals of the FET amplifier stages, said FET amplifier stages producing an amplified RF signal over a bandwidth at an RF output of the last FET amplifier stage;
   an off-chip bias circuit comprising a common input for receiving a DC bias current from a DC supply and a plurality of parallel-connected bias chokes among which the DC bias current is divided, each bias choke comprising a series inductor L connected to a grounded capacitor C, said series inductor L having sufficient impedance to block RF energy from reaching the common input over the entire bandwidth; and
   a plurality of connections that electrically and physical connected the plurality of series inductors L in parallel to a like plurality of the drain terminals at different FET amplifier stages to supply DC bias current at different locations along the output transmission line.

2. The distributed amplifier of claim 1, wherein the bandwidth is at least 120% of a center RF frequency.

3. The distributed amplifier of claim 1, wherein the input transmission lines have a characteristic impedance $Z_0$ of approximately 50 ohms.

4. The distributed amplifier of claim 1, wherein a single bias choke can supply a maximum DC bias current limited by the diameter of a wire that forms the series inductor L, wherein said plurality of parallel-connected bias chokes provide a DC bias current capability greater than said maximum DC bias current of a single bias choke.

5. The distributed amplifier of claim 1, wherein each said bias choke supplies approximately the same amount of DC bias current.

6. The distributed amplifier of claim 1, wherein each said series inductor L has an inductance of at least 3 nH.

7. The distributed amplifier of claim 1, wherein each said series inductor L is a wire-wound inductor.

8. The distributed amplifier of claim 1, wherein each said FET amplifier stage sees a load impedance at its drain terminal, wherein the inductance values of each series inductor L is configured to modify the load impedance of the FET amplifier stage to which it is connected to approximate a target inductance.

9. The distributed amplifier of claim 1, wherein at least one of the FET amplifier stages sees a load impedance at its drain terminal that absent the off-chip bias circuit is capacitive over at least the lower end of the bandwidth, wherein said off-chip bias circuit includes one said bias choke that is connected to the drain terminal of that FET amplifier stages, said bias choke's series inductor L providing sufficient inductance to modify the load impedance of the FET amplifier stage such that the load impedance is inductive over the entire bandwidth.

10. The distributed amplifier of claim 1, wherein a plurality of the FET amplifier stages each see a load impedance at its drain terminal that absent the off-chip bias circuit is capacitive over at least the lower end of the bandwidth, wherein said off-chip bias circuit includes a plurality of said bias chokes that are connected to the drain terminals of those FET amplifier stages, said bias choke's series inductor L providing sufficient inductance to modify the load impedance of the FET amplifier stage such that the load impedance is inductive over the entire bandwidth.

11. The distributed amplifier of claim 10, wherein all of the FET amplifier stages see a load impedance that is inductive over the entire bandwidth.

12. The distributed amplifier of claim 10, wherein at least two of the series inductors L have different inductance values.

13. The distributed amplifier of claim 1, wherein the connections provide negligible inductance compared to the chokes series inductor L, insufficient to block RF energy over the bandwidth absent the off-chip series inductor L.

14. A distributed amplifier, comprising:
   a distributed amplifier monolithic microwave integrated circuit (MMIC) chip, said chip comprising an RF input configured to receive an RF signal that propagates down an input transmission line, a plurality of parallel-connected FET amplifier stages and an output transmission line that connects the drain terminals of the FET amplifier stages, said FET amplifier stages producing an amplified RF signal over a bandwidth at an RF output of the last FET amplifier stage, at least one said amplifier stage seeing a load impedance at its drain terminal that is capacitive over at least the lower end of the bandwidth;
   an off-chip bias circuit comprising a common input for receiving a DC bias current from a DC supply and a plurality of parallel-connected bias chokes among which the DC bias current is divided, each bias choke comprising a series inductor L connected to a grounded capacitor C, said series inductor L having sufficient impedance to block RF energy from reaching the common input over the entire bandwidth; and
   a plurality of connections that electrically and physical connected the plurality of series inductors L in parallel to a like plurality of the drain terminals at different FET amplifier stages to supply DC bias current at different locations along the output transmission line,
   wherein one of said plurality of bias chokes is connected to each of the at least one said amplifier stages that see a capacitive load impedance, said series inductors L providing sufficient inductance to modify the load impedance of the FET amplifier stage such that the load impedance is inductive over the entire bandwidth.

15. A method of off-chip biasing of a amplifier monolithic microwave integrated circuit (MMIC) chip, said chip comprising an RF input configured to receive an RF signal that propagates down an input transmission line, a plurality of parallel-connected FET amplifier stages and an output transmission line that connects the drain terminals of the FET amplifier stages, said FET amplifier stages producing an amplified RF signal over a bandwidth at an RF output of the last FET amplifier stage, said method comprising:
   providing an off-chip bias circuit comprising a common input and a plurality of parallel-connected bias chokes, each bias choke comprising a series inductor L connected to a grounded capacitor C;
   connecting the common input to a DC supply to draw a DC bias current;
   connecting the plurality of series inductors L in parallel to a like plurality of the drain terminals at different FET amplifier stages to divide the DC bias current among the bias chokes and supply portions of the DC bias current at different locations along the output transmission line, wherein said series inductor L has sufficient impedance to block RF energy from reaching the common input over the entire bandwidth.

16. The method of claim 15, wherein a single bias choke can supply a maximum DC bias current limited by the diameter of a wire that forms the series inductor L, wherein said plurality of parallel-connected bias chokes provide a DC bias current capability greater than said maximum DC bias current.

17. The method of claim 15, wherein absent the off-chip bias circuit at least one said amplifier stage sees a load impedance at its drain terminal that is capacitive over at least the lower end of the bandwidth, wherein one of said plurality of bias chokes is connected to each of the at least one said amplifier stages that see a capacitive load impedance, said series inductors L providing sufficient inductance to modify the load impedance of the FET amplifier stage such that the load impedance is inductive over the entire bandwidth.

18. The method of claim 17, wherein all of the FET amplifier stages see a load impedance that is inductive over the entire bandwidth.

19. The method of claim 17, wherein at least two of the series inductors L have different inductance values.

20. The method of claim 17, wherein each said FET amplifier stage sees a load impedance at its drain terminal, wherein the inductance values of each series inductor L is configured to modify the load impedance of the FET amplifier stage to which it is connected to approximate a target inductance.

* * * * *